United States Patent [19]

Meyer et al.

[11] 4,276,534
[45] Jun. 30, 1981

[54] A CONTACTLESS RESISTANCE POTENTIOMETER

[75] Inventors: Juergen Meyer, Taunusstein; Norbert Schaaf, Wiesbaden; Claus Kunze, Taunusstein, all of Fed. Rep. of Germany

[73] Assignee: Heimann GmbH, Fed. Rep. of Germany

[21] Appl. No.: 37,824

[22] Filed: May 10, 1979

[30] Foreign Application Priority Data

May 23, 1978 [DE] Fed. Rep. of Germany ....... 2822477

[51] Int. Cl.$^3$ .............................................. H01L 31/08
[52] U.S. Cl. .................................... 338/15; 250/211 K
[58] Field of Search ............... 338/15, 18; 250/211 K, 250/211 J

[56] References Cited

U.S. PATENT DOCUMENTS

| 3,013,232 | 12/1961 | Lubin | 338/15 X |
| 3,085,159 | 4/1963 | McNaney | 250/211 |
| 3,087,069 | 4/1963 | Moncrieff-Yeates | 250/211 |
| 3,222,531 | 12/1965 | Morrison | 338/15 X |
| 3,358,150 | 12/1967 | Summer | 250/227 |
| 3,539,816 | 11/1970 | Chamberlin | 250/211 |

FOREIGN PATENT DOCUMENTS 2304547 8/1974 Fed. Rep. of Germany .

Primary Examiner—C. L. Albritton
Attorney, Agent, or Firm—Hill, Van Santen, Steadman, Chiara & Simpson

[57] ABSTRACT

The present invention involves a structure of a contactless ohmic resistance potentiometer. A current path between two exterior electrodes is provided by a photoconductor, and a means is provided for causing an exposure of a portion of the length of the photoconductor between one exterior electrode and a tapping electrode. This permits a voltage division between two exterior electrodes. The usable surface of the photoconductor layer is delimited by an exterior electrode and a tapping electrode having a definite geometric course between the exterior electrodes. The distance ratio from the tapping electrode to the two exterior electrodes is varied by means of displacing the exposure of the photoconductor which causes the active partial surface of the photoconductor to be varied at will.

4 Claims, 2 Drawing Figures

A CONTACTLESS RESISTANCE POTENTIOMETER

FIELD OF THE INVENTION

The invention relates to a contactless resistance potentiometer having two outer electrodes and a tap for dividing the resistance.

BACKGROUND OF THE INVENTION

Classic potentiometers consist of an ohmic resistance element formed of a coiled wire or of an extended resistance wire or of a resistance path. The element has two electric connections at the exterior and therebetween a movable sliding contact forms a tapping electrode. The sliding contact is activated either via a sliding device or via a rotary device. If one applies a voltage to the exterior electrodes, the tap divides this voltage according to its position along the resistor path. The divided voltages are proportional to the resistance portions lying between tap and exterior electrodes. The total ohmic resistance thereby always remains the same. Such classic potentiometers have the disadvantage that the sliding contact becomes noisy and that the life span is delimited by the wear and tear of the contact.

The tap can be designed contactlessly in order to prevent this. Either the sliding contact is replaced by a different contacting, for example, by exposing the desired tap location in a photoconductor rail, which then produces the connection of the point in the resistance element corresponding with the point to be contacted with the tapping electrode, or one alters the resistance value of two partial elements with fixed tap connection by means of exterior influencing, for example, by means of a magnetic field in magnetic field-dependent resistance elements.

In the first case, the disadvantage exists that the activated portion of the photoconductor layer which produces the contact to the tapping electrode has itself a resistance value. In the second case, a linearity is difficult to produce, in particular when an electronic circuit connected to the subjective divider arrangement is required in order to divide the desired electric magnitude.

BRIEF SUMMARY OF THE INVENTION

The present invention has the underlying object of providing a resistance potentiometer which has no galvanic tapping contact and which can be strictly linear without great technical expense.

In order to resolve this objective in a potentiometer of the initially mentioned type, it is inventively suggested that a photoconductor layer is used as resistance element, that the usable surface of the photoconductor layer is delimited by the exterior electrode and is subdivided by a tapping electrode having a definite geometric course between the exterior electrodes, and that a partial surface remaining constant as to magnitude is electrically active between the exterior electrodes by means of exposure, whereby the distance ratio from the tapping electrode to the two exterior electrodes and thus the ratio of the ohmic resistance is varied by means of displacing the exposure and thus the active partial surface along side of the tapping electrode.

Two fundamental embodiments are possible. In accordance with one, the resistance divider ratio is adjusted by means of a translatory sliding motion. A corresponding embodiment of an inventive potentiometer is characterized in that the two exterior electrodes form parallel straight lines and that the tapping electrode forms a line proceeding from one end of the first exterior electrode to that end of the second exterior electrode which lies opposite the other end of the first exterior electrode.

An advantageous design of this one embodiment consists thereof that a linear interrelationship between the partial surface displacement and the resistance divider ratio exists and that the tapping electrode forms a straight line relative thereto.

The other fundamental embodiment of my inventive potentiometer uses a rotary motion for displacement of the exposed active partial surface of the photoconductor layer. It is characterized in that the first exterior electrode lies essentially punctiformly in the center of a circular surface of the photoconductor layer and that the second exterior electrode circularly surrounds this circular surface, that the tapping electrode describes a path between the two exterior electrodes, whose radius is a function of the circular angle, and that the exposed surface is a rotary radial circular segment, in particular a circular sector.

An advantageous embodiment of this execution consists thereof that a linear interrelationship between the rotation of the exposed circular sector and the resistance divider ratio exists and that thereto the tapping electrode with its radius r takes a course which is dependent upon the rotary angle $\phi$, upon the smallest radius $r_0$ and upon the greatest radius $r_1$ in accordance with the formula $$r(\phi) = r_0 \exp\left(\frac{\phi}{2\pi} \ln \frac{r_1}{r_0}\right).$$

For the two basic embodiments of the inventive resistance potentiometer one can make a free choice of the function inter-relationship between displacement motion and resistance divider ratio. Only the tapping electrode in regard to the exterior electrodes must take a corresponding course as, perhaps, according to a sine function or according to a logarithmic function. However, generally one will select a linear inter-relationship between displacement and resistance divider ratio. Nevertheless, so-called function potentiometers can be produced without additional technological expense, because the electrode structures are attached to the photoconductor layer with the aid of masks generally produced in a photolithographic process, e.g., with a silk screen process, or they are vapor-deposited.

The displacement of the exposed partial surface of the photoconductor layer proceeds by means of translatory displacement of a slit diaphragm in parallel to the exterior electrodes or by means of rotating a diaphragm, in particular a sector diaphragm, coaxially relative to the exterior electrodes. The exposure proceeds by means of the diaphragm with a suitable light source, for example, a luminous diode. For an even exposure, this light source is advantageously connected via a photo conductor. The sum of the partial resistances remains constant independent of the position of the exposed partial surface.

BRIEF DESCRIPTION OF THE DRAWINGS

With the aid of two sample embodiments illustrated in the Figures of the drawing, the invention is to be more precisely explained.

DESCRIPTION OF THE PREFERRED EMBODIMENTS

Figure 1:
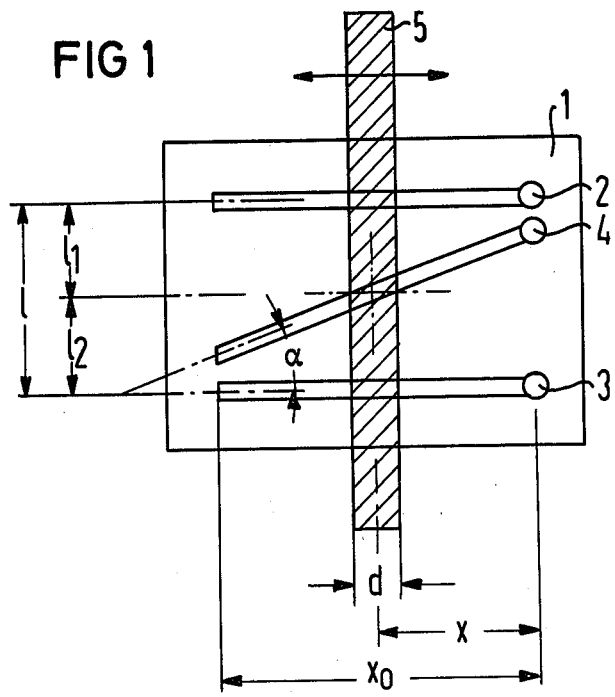
FIG. 1 schematically illustrates an embodiment with translatory shifting motion.

A top view of one preferred embodiment is shown in FIG. 1, where the electrode surface of this inventive resistance potentiometer is in the form of a so-called sliding potentiometer. 1 references a photoconductor layer which, for example, consists of a CdS-layer with the aid of which a substrate such as, for example, black or white ceramic consisting of $Al_2O_3$ or glass was coated. Conductor paths in the form of two parallel straight lines, as the two exterior electrodes 2 and 3, are mounted onto the photoconductor layer 1, for example, by means of vapor deposition. An additional conductor path, as tapping electrode 4, lies between the exterior electrodes 2 and 3 in the form of a straight line under the angle α. The conductor paths, for example, consist of In or Al or a different metal which forms an ohmic contact with CdS. A rectangular surface 5, marked in shadings, represents the partial surface of photoconductor layer 1 exposed by means of a slit diaphragm, and lies transversely across electrodes 2, 3 and 4 as a narrow rectangle. This partial surface 5 can be displaced in parallel relative to the exterior electrodes 2 and 3, indicated by arrows in the drawing. The tapping electrode 4 divides the exposed photoconductor surface lying between the exterior electrodes 2 and 3 according to the position of partial surface 5.

Partial surface 5 is electrically activated by the exposure and forms an ohmic resistance for a current flowing between the two exterior electrodes 2 and 3, this resistance being divided by means of tapping electrode 4. Then an ohmic resistance lies between the tapping electrode 4 and the first exterior electrode 2 in proportion to the distance $l_1$, between the tapping electrode 4 and the second exterior electrode 3 lies an ohmic resistance in proportion to distance $l_2$. $l_1+l_2+1+\text{const}$. The length of the exterior electrodes 2 and 3, i.e., the displacement path of the partial surface 5 is referenced $x_o$, the position of partial surface 5 relative to the initial position, on the right in the picture, is referenced x. The width of partial surface 5 is d, the thickness of photoconductor layer 1 is δ and ρ is the resistivity. The course of the resistance division can be illustrated with these reference symbols, as $$R_1 = \frac{\rho \cdot l_1}{\delta} = \frac{\rho \cdot l}{\delta \cdot d \cdot x_o} \cdot x$$

$$R_2 = \frac{\rho \cdot l_2}{\delta \cdot d} = \frac{\rho \cdot l}{\delta \cdot d \cdot x_o} \cdot (x_o - x)$$

$$R_1 + R_2 = \frac{\rho \cdot l}{\delta \cdot d}$$

Thus, with a straight line as tapping electrode 4, a strictly linear interrelationship between divider position and resistance divider ratio results.

The exposure of partial surface 5 is advantageously carried out by means of a slit diaphragm which can be displaced via a photoconductor layer 1. The exposure source is situated in the tip of a pyramid consisting of acrylic glass, whose wall surfaces have an opening angle of smaller than or equal to 23°. Thereby, these walls reflect totally. The slit diaphragm is seated at the base of the pyramid. Such a pyramid as photo-conductor guarantees an even light distribution on the partial surface 5 of photoconductor layer 1.

Figure 2:
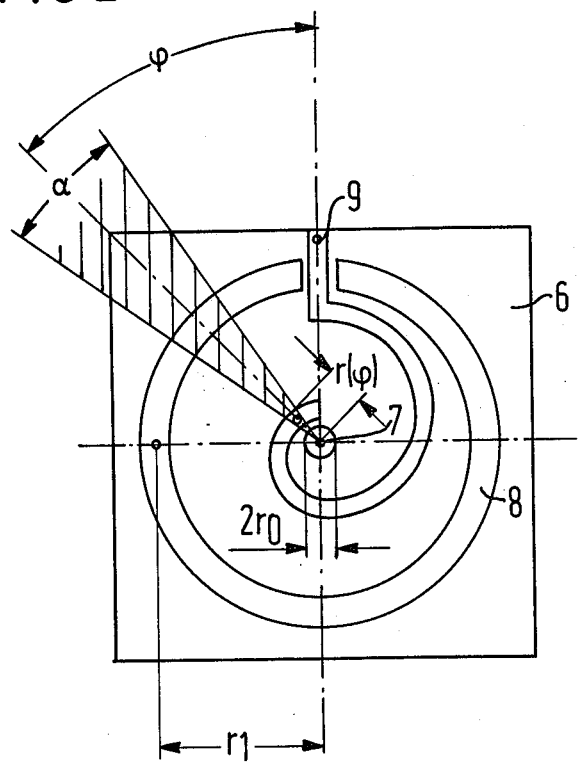
FIG. 2 schematically illustrates an embodiment with rotary motion.

FIG. 2 illustrates a so-called rotary potentiometer. A photoconductor layer 6 again has an electrode path structure with two exterior electrodes 7 and 8 and a tapping electrode 9. The production of the photoconductor layer 6 and of the electrode structure corresponds with the one of the sample embodiment according to FIG. 1. The one exterior electrode 7, however, is situated here punctiformly in the center of a circle which is outlined by the other exterior electrode 8. Therebetween lies the usable circular surface of photoconductor 6. Tapping electrode 9 outlines a path about the center via an angle of 360° with an angle-dependent function of its radius $r+f(\phi)$ and is conveyed to the outer contacting means through an interruption gap in the exterior electrode 8. Such a contacting also expediently proceeds for the exterior electrode, 7 and 8 through laser-bored holes by means of the substrate onto which the photoconductor layer 6 is formed. The exposure results, again advantageously via a pyramid-shaped photoconductor, via a sector diaphragm which can be coaxially rotated relative to the exterior electrodes 7 and 8. The exposed sector with the opening angle α is drawn in dashes, its angle position relative to the angle of conveying-out the tapping electrode 9, is referenced φ. $r_o$ is essentially the radius of the exterior electrode 7, $r_1$ is the radius of the exterior electrode 8.

The course of tapping electrode 9 can be described with these reference symbols for showing a linear dependency upon the resistance divider ratio upon the rotary position by means of the formula $$r(\phi) = r_o \exp(\frac{\phi}{2\pi} \ln \frac{r_1}{r_o})$$

For the ohmic resistance between the exterior electrode 7 and tapping electrode 9 holds true $$R_1 = \frac{\rho}{\alpha \cdot \delta} \cdot \ln \frac{r}{r_o} = \frac{\rho}{\alpha \cdot \delta} \cdot \frac{\phi}{2\pi} \cdot \ln \frac{r_1}{r_o}.$$

For an exact linear course of the divider ratio in dependency upon rotary angle φ, one must undertake in practice slight empiric corrections of electrodes 7, 8, 9, as tapping electrode 9 has a finite width and is not concentric relative to the exterior electrodes 7 and 8 within the diaphragm angle.

It will be apparent to those skilled in the art that many modifications and variations may be effected without departing from the spirit and scope of the novel concepts of the present invention.

We claim as our invention:

1. A contactless resistance potentiometer having two exterior electrodes and a tap for dividing the resistance, characterized in that a photoconductor layer is used as resistance element, the usable surface of the photoconductor layer being delimited by two exterior electrodes and being subdivided by a tapping electrode having a definite geometric course between said exterior electrodes, and a partial surface between the exterior electrodes remaining constant as to its size being electrically active by means of exposure, whereby the distance ratio from said tapping electrode relative to said two exterior electrodes is varied by means of displacing the exposure and thus displacing the active partial surface alongside of tapping electrode, in which a first one of said exterior electrodes essentially lies punctiformly in the center of a circular surface of said photo-conductor layer and that the second one of said exterior electrodes circularly surrounds said circular surface, the tapping electrode describing a path between said two exterior electrodes whose radius is a function of the circular angle and in which the exposed surface is a rotary radial circular segment, and in which a linear interrelationship between the rotation of the exposed circular sector and the resistance divider ratio exists, and that the tapping electrode with its radius r takes a course dependent upon rotary angle ($\phi$), upon the smallest radius $r_o$ and upon the largest radius $r_1$ according to the formula $$r = r_o \exp\left(\frac{\phi}{2\pi} \ln \frac{r_1}{r_o}\right).$$

2. A contactless resistance potentiometer comprising a substrate, a photoconductor layer on said substrate, a ring-shaped circular electrode formed on the surface of said substrate, said ring-shaped circular electrode having a gap therein, a second electrode formed on said surface of said photoconductor layer at the center of said ring-shaped electrode, a third electrode on said surface of said photoconductor layer extending in a spiral from said second electrode and terminating through said gap in said circular electrode, gradually increasing in its radius of curvature to a point opposite said gap and then out through said gap, means for rendering a radially directed portion of said surface of said photoconductor layer conductive between said second electrode and said first electrode, and means for rotatably altering the location of said conductive portion of said photoconductor surface.

3. A contactless resistance potentiometer with two exterior electrodes and a tap electrode for dividing the resistance wherein a photoconductive layer is used as a resistance element characterized in that:

a first of said exterior electrodes has an essentially circular shape with a selected radius and said circular shape is interrupted for a selected segment length, a second of said exterior electrodes is located at essentially the center of said first circular electrode, said tap electrode is disposed between said two exterior electrodes and has a selected spiral-like shape of increasing radius with an end extending through said selected segment in said first electrode, said photoconductive layer is disposed between said exterior electrodes and said tap electrode, means for exposing radial regions of said photoconductive layer, said means is adapted to rotate about said center of said first electrode.

4. The potentiometer according to claim 3 wherein said means comprises a rotatable sector-shaped diaphragm for exposing a sector-shaped region of said electrodes and said photoconductive layer.

* * * * *